(12) United States Patent
Heo

(10) Patent No.: US 10,637,128 B2
(45) Date of Patent: Apr. 28, 2020

(54) ELECTRONIC DEVICE FOR GRIP SENSING AND METHOD FOR OPERATING THEREOF

(71) Applicant: SAMSUNG ELECTRONICS CO., LTD., Suwon-si, Gyeonggi-do (KR)

(72) Inventor: Young Heo, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 45 days.

(21) Appl. No.: 16/139,455

(22) Filed: Sep. 24, 2018

(65) Prior Publication Data

US 2019/0103659 A1 Apr. 4, 2019

(30) Foreign Application Priority Data

Sep. 29, 2017 (KR) ........................ 10-2017-0127968

(51) Int. Cl.
*H01Q 1/00* (2006.01)
*H01Q 1/24* (2006.01)
(Continued)

(52) U.S. Cl.
CPC .............. *H01Q 1/245* (2013.01); *G01L 1/144* (2013.01); *G06F 1/1601* (2013.01); *G06F 3/011* (2013.01);
(Continued)

(58) Field of Classification Search
CPC ...... H01Q 1/245; H01Q 1/243; H01Q 13/103; G01L 1/144; G06F 1/1601; G06F 3/011; H03K 17/955; H03K 17/962; H03K 2217/960755; H04M 1/72569; H04M 1/026; H04M 2250/12; G01B 7/14
(Continued)

(56) References Cited

U.S. PATENT DOCUMENTS 5,736,937 A * 4/1998 McGirr ................... G01P 3/481
324/402
2002/0084913 A1 7/2002 Hudson et al.
(Continued)

FOREIGN PATENT DOCUMENTS

KR 10-2007-0001440 1/2007
KR 10-2013-0127434 11/2013
(Continued)

OTHER PUBLICATIONS

Search Report and Written Opinion dated Dec. 17, 2018 in counterpart International Patent Application No. PCT/KR2018/011546.

*Primary Examiner* — Max H Noori

(74) *Attorney, Agent, or Firm* — Nixon & Vanderhye, P.C.

(57) ABSTRACT

An electronic device according to various embodiments includes: a housing; a plurality of metallic parts forming a portion of the housing; a clock generator disposed in the housing; and a processor is configured to sense a grip on the electronic device based on a current loop formed by a first signal generated by the clock generator and transmitted through a first metallic part and a second metallic part of the plurality of metallic parts, wherein the second metallic part is disposed adjacent to the first metallic part with a first separator disposed between the first metallic part and the second metallic part and configured to electrically separate the first metallic part and the second metallic part.

20 Claims, 12 Drawing Sheets

(51) Int. Cl.
*G01L 1/14* (2006.01)
*H03K 17/96* (2006.01)
*H01Q 13/10* (2006.01)
*G06F 3/01* (2006.01)
*H04M 1/725* (2006.01)
*G06F 1/16* (2006.01)
*H03K 17/955* (2006.01)
*H04M 1/02* (2006.01)
*G01B 7/14* (2006.01)

(52) U.S. Cl.
CPC ........... *H01Q 1/243* (2013.01); *H01Q 13/103* (2013.01); *H03K 17/955* (2013.01); *H03K 17/962* (2013.01); *H04M 1/72569* (2013.01); *G01B 7/14* (2013.01); *H03K 2217/960755* (2013.01); *H04M 1/026* (2013.01); *H04M 2250/12* (2013.01)

(58) Field of Classification Search
USPC .................................................. 73/862.626
See application file for complete search history.

(56) References Cited

U.S. PATENT DOCUMENTS

| | | |
|---|---|---|
| 2007/0002016 A1 | 1/2007 | Cho et al. |
| 2014/0118011 A1 | 5/2014 | Burger et al. |
| 2014/0188561 A1* | 7/2014 | Tenbrock .............. G06F 21/316 705/7.32 |
| 2015/0205400 A1 | 7/2015 | Hwang et al. |
| 2015/0237183 A1 | 8/2015 | Novet |
| 2015/0380812 A1 | 12/2015 | Black et al. |
| 2016/0057578 A1 | 2/2016 | Rouaissia et al. |
| 2016/0076952 A1 | 3/2016 | Kim |
| 2017/0047641 A1 | 2/2017 | Kim et al. |
| 2018/0005964 A1* | 1/2018 | Ordas ..................... G06F 21/87 |
| 2019/0067801 A1* | 2/2019 | Kang ..................... H01Q 1/245 |

FOREIGN PATENT DOCUMENTS

| | | |
|---|---|---|
| KR | 10-2017-0019846 | 2/2017 |
| WO | 2010/115940 | 10/2010 |

* cited by examiner

ELECTRONIC DEVICE FOR GRIP SENSING AND METHOD FOR OPERATING THEREOF

CROSS-REFERENCE TO RELATED APPLICATION

This application is based on and claims priority under 35 U.S.C. § 119 to Korean Patent Application Serial No. 10-2017-0127968, which was filed in the Korean Intellectual Property Office on Sep. 29, 2017, the disclosure of which is incorporated by reference herein in its entirety.

TECHNICAL FIELD

The present disclosure relates to an electronic device for grip sensing and a method for operating the electronic device.

BACKGROUND

It is possible to determine whether a user is using an electronic device by sensing a grip on the electronic device. While a user uses an electronic device, the electronic device can provide various suitable functions to the user. For example, it is possible to reduce the frequency output of a radio communication module to satisfy standard authentication of electromagnetic wave absorption rate on an electronic device while a user uses the electronic device. The performance of wireless communication may be deteriorated while a user uses an electronic device, but it is possible to control the amount of electromagnetic waves that may be harmful to the user under a threshold level.

It is possible to recognize a grip on an electronic device by sensing a change of the capacity of a capacitor, using a grip sensor in the electronic device. The capacity of a capacitor of an electronic device may be changed in various situations such as when an electronic device is touched by a portion of a human body, clothes, books, or plastics, when an electronic device is on a desk, or when a charger or an earphone is connected to an electronic device, so it may be difficult to accurately recognize a user holding an electronic device.

SUMMARY

An electronic device according to various example embodiments can accurately sense a grip on an electronic device using a first metallic part and a second metallic part that are disposed adjacent to each other among a plurality of metallic parts included in the electronic device, and a first separator disposed between the first metallic part and the second metallic part.

An electronic device according to various embodiments can sense and discriminate the position and intensity of a grip on the electronic device.

According to an aspect of the present disclosure, an electronic device includes: a housing; a plurality of metallic parts disposed to form a portion of the external appearance of the housing; a clock generator disposed in the housing; and a processor configured to sense a grip on the electronic device based on a current loop formed by a first signal generated by the clock generator through a first metallic part and a second metallic part of the plurality of the metallic parts, wherein the second metallic part is disposed adjacent to the first metallic part with a first separator disposed between the first metallic part and the second metallic part and configured to electrically separate the first metallic part and the second metallic part.

According to another aspect of the present disclosure, a method of sensing a grip on an electronic device, includes: transmitting a first signal generated by the clock generator included in an electronic device to a first metallic part of a plurality of metallic parts forming a portion of the external appearance of a housing of the electronic device, and sensing a grip on the electronic device based on a current loop formed by the first signal through the first metallic part and a second metallic part of the plurality of metallic parts, wherein the second metallic part is disposed adjacent to the first metallic part with a first separator disposed between the first metallic part and the second metallic part and configured to electrically separate the first metallic part and the second metallic part.

According to another aspect of the present disclosure, a non-transitory computer-readable recording medium having stored thereon instructions which, when executed by a processor, cause an electronic device to perform at least one operation, the at least one operation including: transmitting a first signal generated by a clock generator included in an electronic device to a first metallic part of a plurality of metallic parts forming a portion of the external appearance of a housing of the electronic device; and sensing a grip on the electronic device based on a current loop formed by the first signal through the first metallic part and a second metallic part of the plurality of metallic parts, wherein the second metallic part is disposed adjacent to the first metallic part with a first separator disposed between the first metallic part and the second metallic part and configured to electrically separate the first metallic part and the second metallic part.

An electronic device according to various embodiments can sense a grip on the electronic device, using a plurality of metallic parts included in the electronic device and at least one separator disposed between two metallic parts disposed adjacent to each other among the plurality of the metallic parts.

An electronic device according to various embodiments can discriminate a grip on the electronic device by a user and a grip on the electronic device by an object based on the difference of a loss of a first signal when two metallic parts disposed adjacent to each other forms a current loop by the first signal generated by a clock generator.

An electronic device according to various embodiments can accurately sense the position and the intensity of a grip on the electronic device when the electronic device is gripped.

An electronic device according to various embodiments can reduce the output voltage of an antenna or change the resonance frequency of the antenna based on a sensed grip on the electronic device.

BRIEF DESCRIPTION OF THE DRAWINGS

The above and other aspects, features, and advantages of the present disclosure will be more apparent from the following detailed description, taken in conjunction with the accompanying drawings, in which.

DETAILED DESCRIPTION

Figure 1:
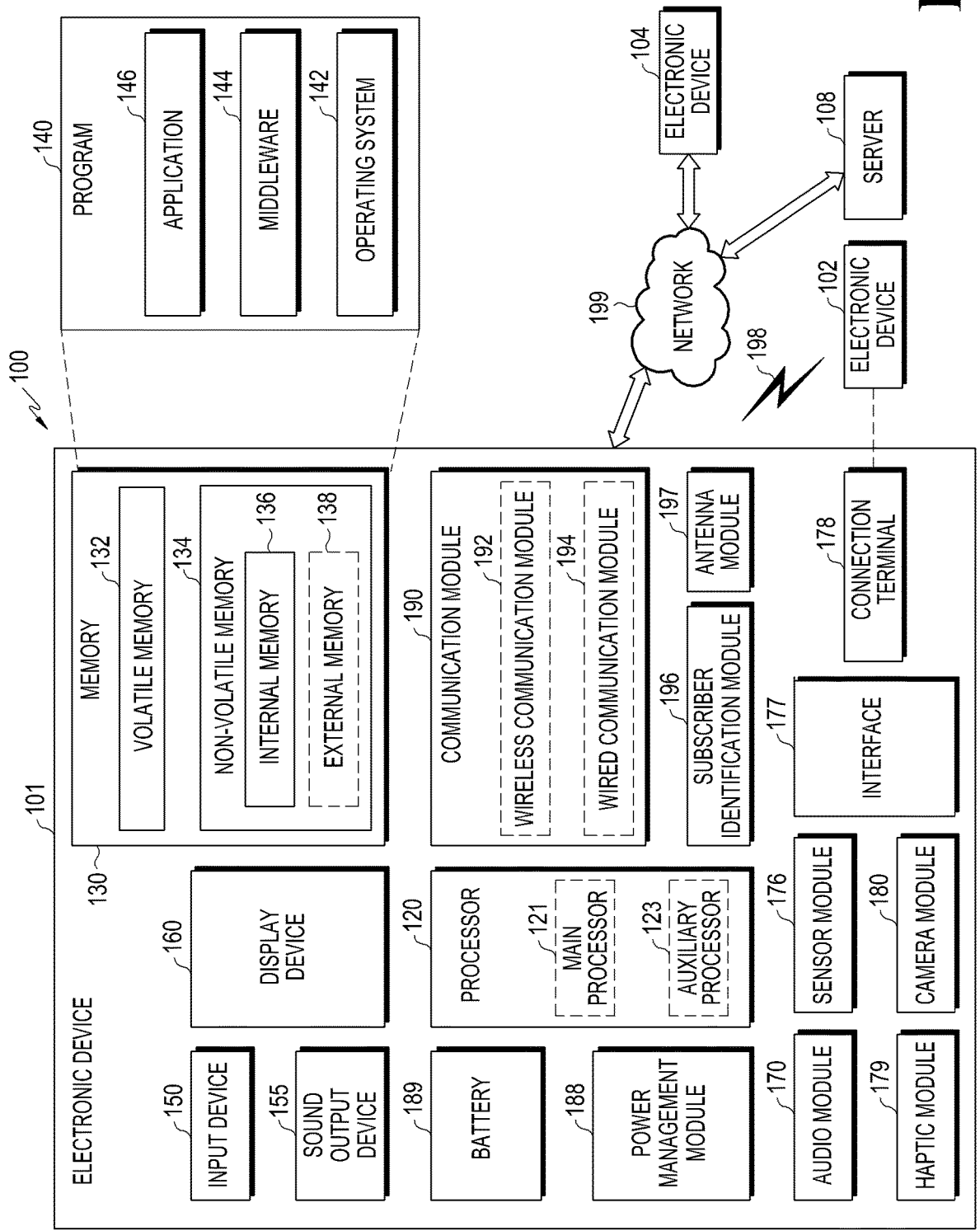
FIG. 1 is a block diagram illustrating an electronic device in a network environment according to various embodiments.

FIG. 1 is a block diagram of an electronic device 101 in a network environment 100 according to various embodiments. Referring to FIG. 1, the electronic device 101 in the network environment 100 can communicate with an electronic device 102 through a first network 198 (e.g. near field communication) and/or can communicate with an electronic device 104 and/or a server 108 through a second network 199 (e.g., long distance wireless communication). According to an embodiment, the electronic device 101 can communicate with the electronic device 104 through the server 108. According to an embodiment, the electronic device 101 may include a processor (e.g., including processing circuitry) 120, a memory 130, an input device (e.g., including input circuitry) 150, a sound output device (e.g., including sound output circuitry) 155, a display device 160, an audio module (e.g., including audio circuitry) 170, a sensor module 176, an interface (e.g., including interface circuitry) 177, a haptic module (e.g., including haptic circuitry) 179, a camera module 180, an power management module 188, a battery 189, a communication module (e.g., including communication circuitry) 190, a subscriber identification module 196, and an antenna module 197. In an embodiment, in the electronic device 101, at least one (e.g., the display device 160 or the camera module 180) of the components may be removed or another component may be added. In an embodiment, for example, some components may be integrated such as the sensor module 176 (e.g., a fingerprint sensor, an iris sensor, or an illumination sensor) embedded in the display device 160 (e.g., a display).

The processor 120, for example, may include various processing circuitry and can control at least one component (e.g., a hardware or software component) connected to the processor 120 of the electronic device 101 by executing software (e.g., a program 140) and can process and calculate various data. The processor 120 can load and process commands or data received from another component (e.g., the sensor module 176 or the communication module 190) in a volatile memory 132, and can store the resultant data in a nonvolatile memory 134. According to an embodiment, the processor 120 may include a main processor 121 (e.g., a central processing unit or an application processor) and a coprocessor 123 (e.g., a graphic processor, an image signal processor, a sensor hub processor, or a communication processor) that is operated independently from the main processor and, additionally or alternatively, uses less power than the main processor 121 or is specified for predetermined functions. The coprocessor 123 may be operated separately from the main processor 121 or may be embedded and operated.

In this case, the coprocessor 123 can control at least some of the functions or states related to at least one (e.g., the display device 160, the sensor module 176, or the communication module 190) of the components of the electronic device 101, for example, instead of the main processor 121 when the main processor 121 is in an inactive (e.g., sleep) state or together with the main processor 121 when the main processor 121 is in an active state (e.g., in operation for executing an application). According to an embodiment, the coprocessor 123 (e.g., an image signal processor or a communication processor) may be implemented as a partial component of another functionally related component (e.g., the camera module 180 or the communication module 190).

The memory 130 can store various data, for example, software (e.g., the program 140) that is used by at least one component (e.g., the processor 120 or the sensor module 176) of the electronic device 101, and can input data or output data for commands related to the software. The memory 130 may include a volatile memory 132 and/or a nonvolatile memory 134.

The program 140, which may, for example, be software stored in the memory 130, for example, may include an operating system 142, a middleware 144, and/or an application 146.

The input device 150, which is a device for receiving commands or data to be used by components (e.g., the processor 120) of the electronic device 101 from the outside (e.g., a user) of the electronic device 101, may include various input circuitry, such as, for example, and without limitation, a microphone, a mouse, and/or a keyboard, or the like.

The sound output device 155, which is a device for outputting sound signals to the outside of the electronic device 101, for example, and without limitation, may include a speaker that is used for common purposes such as playing of multimedia or recorded sounds, and/or a receiver that is used for receiving a telephone call, or the like. According to an embodiment, the receiver may be formed integrally with or separately from the speaker.

The display device 160, which is a device for visually showing information to a user of the electronic device 101, for example, and without limitation, may include a display, a hologram device, and/or a projector, or the like and a control circuit for controlling the corresponding device. According to an embodiment, the display device 160 may include touch circuitry and/or a pressure sensor that can measure the intensity of pressure by a touch.

The audio module 170, for example, may include various audio circuitry that can bidirectionally convert sound and an electrical signal. According to an embodiment, the audio module 170 can acquire a sound through the input device 150 or can output a sound through the sound output device 155 or an external electronic device (e.g., the electronic device 102 (e.g., a speaker or a headphone) connected to the electronic device 101 through a wire or wirelessly.

The sensor module 176 can generate an electrical signal or a data value corresponding to the operation state (e.g., power or temperature) in the electronic device 101 or an external environmental state. The sensor module 176, for example, and without limitation, may include a gesture sensor, a gyro sensor, a barometer sensor, a magnetic sensor, an acceleration sensor, a grip sensor, a proximity sensor, a color sensor, an IR (Infrared) sensor, a biosensor, a temperature sensor, a humidity sensor, and/or an illumination sensor, or the like.

The interface 177 can support a predetermined protocol that allows for connection to an external electronic device (e.g., the electronic device 102) through a wire or wirelessly. According to an embodiment, the interface 177 may include various interface circuitry, such as, for example, and without limitation, a High Definition Multimedia Interface (HDMI), a Universal Serial Bus (USB) interface, an SD card interface, and/or an audio interface, or the like.

A connection terminal 178 may include a connector that can physically connect the electronic device 101 with an external electronic device (e.g., the electronic device 102), such as an HDMI connector, a USB connector, an SD card connector, or an audio connector (e.g., a headphone connector).

The haptic module 179 can convert an electrical signal into a mechanical stimulus (e.g. vibration or movement) or an electrical stimulus that a user can recognize through the sensor touch or the sensation of movement. The haptic module 179, for example, may include various haptic circuitry, such as, for example, and without limitation, a motor, a piezoelectric device, and/or an electric stimulator, or the like.

The camera module 180 can take still images and moving images. According to an embodiment, the camera module 180 may include one or more lenses, an image sensor, an image signal sensor, or a flash.

The power management module 188, which is a module for managing the power that is supplied to the electronic device 101, for example, may be at least a part of a Power Management Integrated Circuit (PMIC).

The battery 189, which is a device for supplying power to one or more components of the electronic device 101, for example, may include a primary battery that is not rechargeable, a secondary battery that is rechargeable, or a fuel cell.

The communication module 190 may include various communication circuitry and can establish a wire or wireless communication channel between the electronic device 101 and an external electronic device (e.g., the electronic device 102, the electronic device 104, and/or the server 108), and can support communication through the established communication channel. The communication module 190 may include one or more communication processors that support wired communication or wireless communication that is operated independently from the processor 120 (e.g., an application processor). According to an embodiment, the communication module 190 may include a wireless communication module 192 (e.g., a cellular communication module, a near field communication module, or a Global Navigation Satellite System (GNSS) communication module) or a wired communication module 194 (e.g., a Local Area Network (LAN) communication module or a power line communication module). Further, the communication module 190 can communicate with an external electronic device through the first network 198 (e.g., a LAN such as Bluetooth, WiFi direct or Infrared Data Association (IrDA)) or through the second network 199 (e.g., a wide area network such as a cellular network, the internet, or a computer network (e.g., a LAN or a WAN), using the corresponding network. The various communication modules 190 described above may be implemented in one chip or separate chips.

According to an embodiment, the wireless communication module 192 can identify and authenticate the electronic device 101 in a communication network, using user information stored in the subscriber identifier module 196.

The antenna module 197 may include one or more antennas for transmitting or receiving signals or power to or from the outside. According to an embodiment, the communication module 190 (e.g., the wireless communication module 192) can transmit or receive signals to or from an external electronic device through an antenna suitable for the communication method.

Some of the components can be connected to each other and exchange signals (e.g., commands or data) with each other through communication methods among peripheral devices (e.g., a bus, a General Purpose Input/Output (GPIO), a Serial Peripheral Interface (SPI), or a Mobile Industry Processor Interface (MIPI).

According to an embodiment, commands or data can be transmitted or received between the electronic device 101 and the external electronic device 104 through the server 108 connected to the second network 199. The electronic devices 102 and 104 may be the same kind of device as the electronic device 101, or may be different therefrom. According to an embodiment, all or some of the operations of the electronic device 101 may be performed by another one or a plurality of external electronic devices. According to an embodiment, when the electronic device 101 has to perform a function or service automatically or due to a request, the electronic device 101 may request at least partial function related to the function or service to an external electronic device additionally or instead of performing the function or service by itself. The external electronic device receiving the request can perform the requested function or an additional function and transmit the result to the electronic device 101. The electronic device 101 can provide the requested function or service based on the received result or by additionally processing the received result. To this end, for example, cloud computing, distributed computing, or client-server computing may be used.

Figure 2:
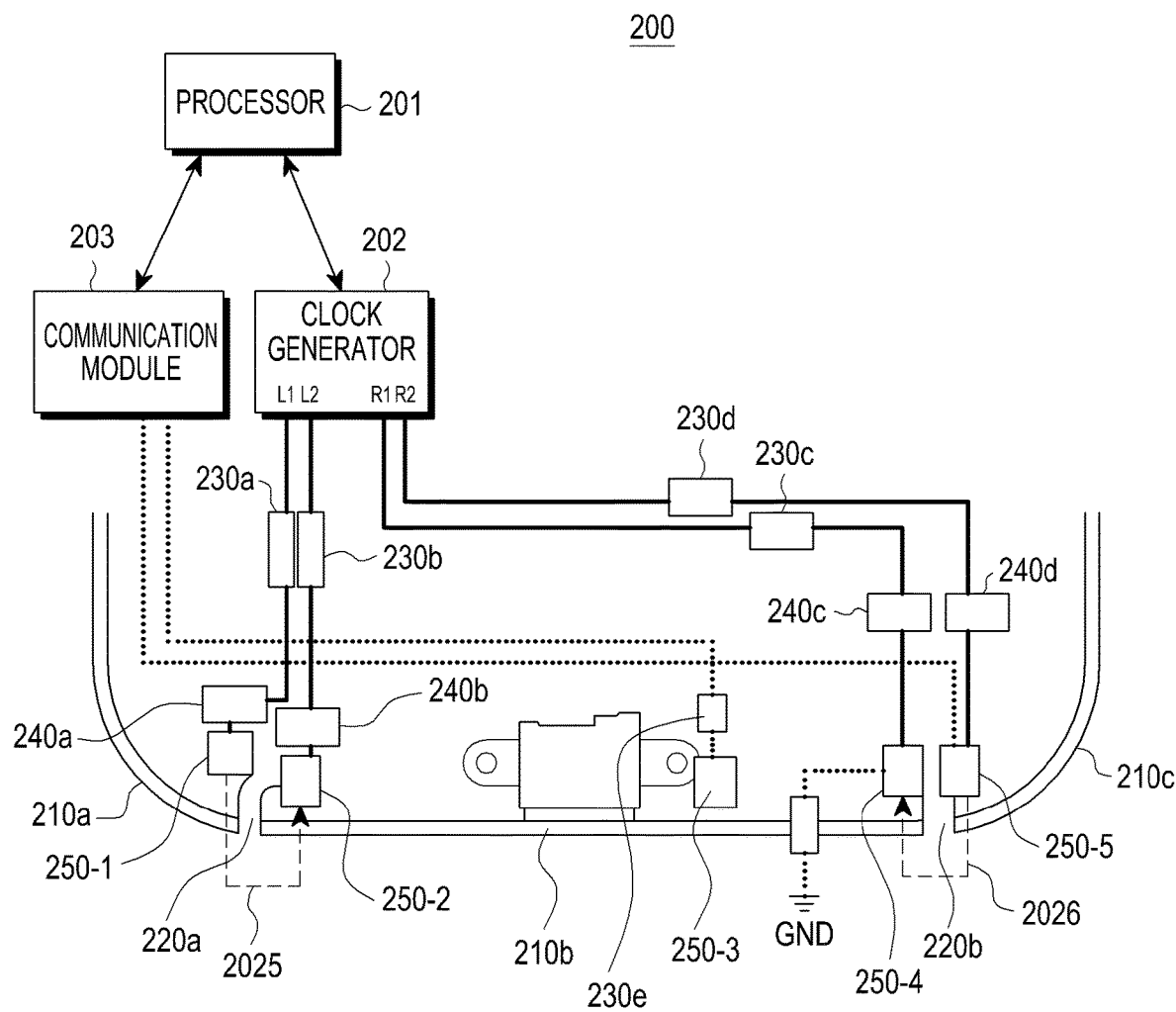
FIG. 2 is a diagram illustrating a configuration of an electronic device according to various embodiments.

FIG. 2 is a diagram illustrating an example configuration of an electronic device 200 (e.g., the electronic device 101 in FIG. 1) according to various example embodiments.

According to various example embodiments, the electronic device 200 may include a housing. Referring to FIG. 2, the electronic device 200 may include a plurality of metallic parts forming a portion of the external appearance of the housing. According to various embodiments, at least one of the metallic parts may be an antenna. For example, referring to FIG. 2, the electronic device 200 may include a first metallic part 210a, a second metallic part 210b, and a third metallic part 210c. According to various embodiments, as shown in FIG. 2, the first metallic part 210a and the second metallic part 210b may be disposed adjacent to each other with a first separator 220a therebetween, and the second metallic part 210b and the third metallic part 210c may be disposed adjacent to each other with a second separator 220b therebetween. According the various embodiments, the adjacent metallic parts 210a, 210b, and 210c can be electrically separated by the separators 220a and 220b. Referring to FIG. 2, for example, the first metallic part 210a and the second metallic part 210b can be electrically separated by the first separator 220a, so a signal transmitted to the first metallic part 210a cannot be transmitted to the second metallic part 210b.

According to various embodiments, at least one of the first metallic part 210a, the second metallic part 210b, and the third metallic part 210c may be an antenna. The antennas can support wireless communication at different frequency bands. For example, the first metallic part 210a may be an antenna supporting wireless communication of 60 GHz, the second metallic part 210b may be an antenna supporting wireless communication of 5 GHz, and the third metallic part 210c may be an antenna supporting wireless communication of 2.5 GHz.

According to various embodiments, the electronic device 200 may include a processor (e.g., including processing circuitry) 201 (e.g., the processor 120 in FIG. 1), a clock generator 202, and a communication module (e.g., including communication circuitry) 203 (e.g., the radio communication module 194 in FIG. 1). The communication module 203 can be connected to at least one antenna. For example, the communication module 203 may be connected and fixed to the second metallic part 210b by a connector 250-3 or may be connected and fixed to the third metallic part 210c by a connector 250-5, as shown in FIG. 2. The second metallic part 210b and the third metallic part 210c may be antennas. The communication module 203 can perform wireless communication using the second metallic part 210b or the third metallic part 210c. For example, a capacitor 230e may be provided between the communication module 203 and the second metallic part 210b for RF communication.

According to various embodiments, the clock generator 202 can periodically generate and transmit same signals. According to various embodiments, the processor 201 can determine the frequency of the signals that are generated by the clock generator 202. For example, the processor 201 can control the clock generator 202 to generate a first-frequency signal within about 1 MHz to 13 MHz. According to various embodiments, the clock generator 202 can be electrically connected to the metallic parts of the electronic device 200. For example, referring to FIG. 2, the clock generator 202 can be electrically connected to the first metallic part 210a and fixed close to the first separator 220a by a connector 250-1. A first capacitor 230a and a first inductor 240a may be disposed between the clock generator 202 and the first metallic part 210a. Referring to FIG. 2, the clock generator 202 can be electrically connected to the second metallic part 210b and fixed close to the first separator 220a by a connector 250-2. A second capacitor 230b and a second inductor 240b may be disposed between the clock generator 202 and the second metallic part 210b. Alternatively, the clock generator 202 can be electrically connected to the second metallic part 210b and fixed close to the second separator 220b by a connector 250-4. A third capacitor 230c and a third inductor 240c may be disposed between the clock generator 202 and the second metallic part 210b. Referring to FIG. 2, a current loop 2025 coming from the clock generator 202 and going back to the clock generator 202 through the first metallic part 210a, the first separator 220a, and the second metallic part 210b is formed. Alternatively, the connection from the clock generator 202 to the second metallic part 210b through the third capacitor 230c and the third inductor 240c may be fixed close to the second separator 220b by the connector 250-4. The connector 250-4 may be connected to the ground GND in relation to the antenna included in the second metallic part 210b and a varistor 260 may be provided between the connector 250-4 and the ground.

A current loop 2026 coming from the clock generator 202 and going back to the clock generator 202 through the second metallic part 210b, the second separator 220b, and the third metallic part 210c may be formed. Referring to FIG. 2, the clock generator 202 can be electrically connected to the third metallic part 210c and fixed close to the second separator 220b by a connector 250-5. A fourth capacitor 230d and a fourth inductor 240d may be disposed between the clock generator 202 and the third metallic part 210c.

According to various embodiments, leakage can be prevented by the capacitors 230a, 230b, 230c, and 230d while signals generated by the clock generator 202 are transmitted to the metallic parts. For example, the capacity of the capacitors may be set to about 10 uF.

According to various embodiments, the inductors 240a, 240b, 240c, and 240d may be high-frequency chips, and a signal generated by the clock generator 202 and a signal transmitted from the communication module 203 to an antenna (e.g., the second metallic part 210b) block each other due to a high-frequency inductor.

According to various embodiments the separator 220a and 220b may be nonconductive members. For example, a plastic material may be used. According to various embodiments, at least one of the metallic parts may be an antenna. For example, the sizes, positions, and shapes of the metallic parts, and the separators may depend on the frequency band, the design, and arrangement of at least one antenna included in the electronic device 200.

According to various embodiments, a first signal generated by the clock generator 202 can be transmitted to the first metallic part 210a to the third metallic part 210c. For example, the first signal can be transmitted from the clock generator 202 to the first metallic part 210a through the first capacitor 230a and the first inductor 240a. According to various embodiments, the first signal transmitted to the metallic part 210a may be lost a lot due to the first separator 220a when it is transmitted to the second metallic part 210b. When a user's hand approaches the first separator 220a, the first signal transmitted to the first metallic part 210a can be transmitted to the second metallic part 210b with a small loss by the user's hand. According to various embodiment, when the difference of a loss between the first signal transmitted to the first metallic part 210a and the first signal transmitted to the second metallic part 210b is smaller than a threshold value, it is possible to determine that the first, metallic part 210a, the first separator 220a, and the second metallic part 210 have formed a current loop. According to various embodiments, as the user's hand comes closer to the first separator 220a, a current loop with a smaller difference of a loss can be formed. As the user's hand comes closer, the user's body functions as a conductive object, so a signal can be transmitted with the loss due to separation compensated. For example, a signal loss can be smaller when the distance between the first separator 220a and a user's hand is 5 mm than when the distance between the first separator 220a and the user's hand is 10 mm. According to various embodiments, when a metallic material approaches the first separator 220a, the first signal may be transmitted to the second metallic part 210b with a larger loss than a threshold value set for a user's hand. According to various embodiments, the electronic device 200 can discriminate a user's hand coming closer and a metallic material coming closer from each other in sensing. According to various embodiments, the electronic device 200 can determine that electronic device is gripped, when a loss of a signal is smaller than a threshold value even though a user's hand approaches or touches the first metallic part 210a or the second metallic part 210b close to the first separator 220a.

According to various embodiments, the electronic device 200 can sense a grip on the electronic device both when a user's hand touches the first separator 220a and when a user's hand touches the second separator 220b. In various embodiments, when sensing a grip on two separators, the electronic device 200 can determine whether it is a grip by the right hand or the left hand of the user.

TABLE 1

| | |
|---|---|
| L2_am1 > R2_am1 | Left hand grip |
| L2_am1 < R2_am1 | Right hand grip |
| L2_am1 == R2_am1 | Grip by both hands or electronic device on horizontal human body |

It is assumed that the amplitude of a signal f0 that is generated by the clock generator 202 and transmitted to the first metallic part 210a is L1_am0. It is assumed that the amplitude of a signal f0 that is generated by the clock generator 202 and transmitted to the second metallic part 210b is R1_am0. It is assumed that the amplitude of a signal f1 received to the second metallic part 210b through the current loop including the first separator 220a is L2_am1. It is assumed that the amplitude of a signal f1 received to the third metallic part 210c through the current loop including the second separator 220b is R2_am1.

Referring to Table 1, when L2_am1 is larger than R2_am1, it can be determined as left-hand grip, and when L2_am1 is smaller than R2_am1, it can be determined as right-hand grip. When L2_am1 and R2_am1 are substantially the same, it can be determined as a both-hand grip or a state in which the electronic device is on a horizontal human body.

According to various embodiments, assuming that the amplitude of a signal f0 generated by the clock signal 202 is am0 and the amplitude of a signal f1 received to the clock generator 202 through the current loop formed from a separator is am1, the intensity of a grip can be determined by comparing am0 and am1 with each other. For example, the intensity of a grip can be divided into "strong", "medium", and "weak", as shown in Table 2.

TABLE 2

| Intensity of signal (am1) received by formed loop | Intensity of grip |
|---|---|
| am1 >= am0 * 0.7 | Strong |
| am0 * 0.7 > am1 >= am0 * 0.4 | Medium |
| am0 * 0.4 > am1 | Weak |

In Table 2, am0 may refer to the amplitude of a signal f0 generated by the clock generator 302. am1 may refer to the amplitude of a signal f1 transmitted to an adjacent metallic part by a loop structure formed by a grip. Referring to Table 1, the electronic device 200 can determine that a grip is strong when am1 is 70% or more of am0. The electronic device 200 can determine that a grip is medium when am1 is less than 70% of am0 and is 40% or more of am0. The electronic device 200 can determine that a grip is weak when am1 is less than 40% of am0. In various embodiments, the intensity of a grip can be divided and determined in more detailed than those in Table 2 and the degree of comparing reference may be set different.

Figure 3:
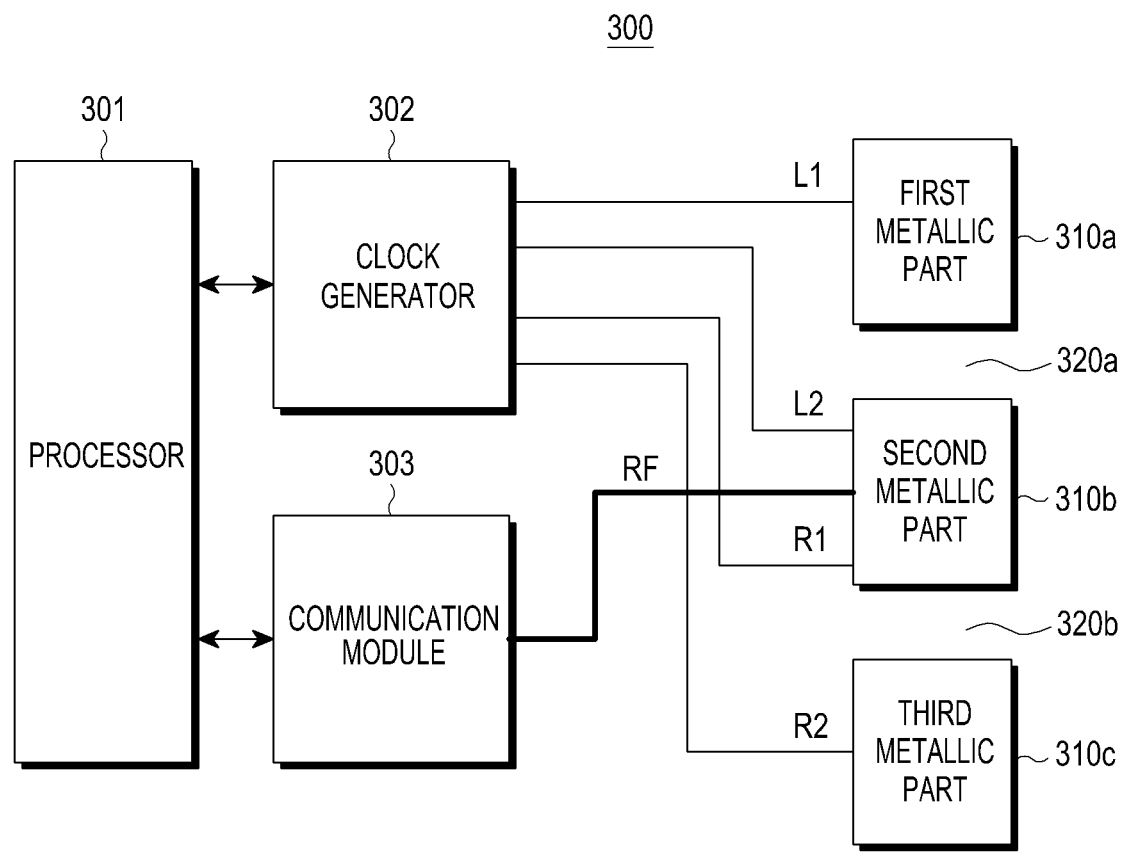
FIG. 3 is a block diagram illustrating an electronic device according to various embodiments.

FIG. 3 is a block diagram illustrating an electronic device according to various example embodiments.

According to various embodiments, an electronic device 300 (e.g., the electronic device 200 in FIG. 2) may include a processor (e.g., including processing circuitry) 301 (e.g. the processor 201 in FIG. 2), a clock generator 302 (e.g., the clock generator 202 in FIG. 2), and a communication module (e.g., including communication circuitry) 303 (e.g., the communication module 203 in FIG. 2). According to various embodiments, signals having same intensity are generated by the clock generator 302 and the signal can be transmitted to one or more components electrically connected to the clock generator 302. According to various embodiments, the processor 301 can control the communication module 303 to perform wireless communication using at least one of at least one antenna included in the electronic device 300. For example, at least one of metallic parts 310a, 310b, and 310c included in the electronic device 300 may be an antenna.

According to various embodiments, the clock generator 302 can generate a first signal and can transmit the first signal to at least one component electrically connected to the clock generator 302, for example, a plurality of metallic parts. For example, when the first signal is transmitted to the first metallic part 310a, the first signal to be received to the second metallic part 310b may have a large loss due to the first separator 320a. According to various embodiments, when a human body part such as a user's finger approaches the first separator 320a, the first signal transmitted to the first metallic part 310a can be transmitted to the second metallic part 310b with a relatively small loss, and in this case, a loop may be formed at the first metallic part 310a and the second metallic part 310b. According to various embodiments, when a loop structure is formed at the first metallic part 310a and the second metallic part 320a, it is possible to determine that a grip has occurred on the electronic device at the first separator 320a between the first metallic part 310a and the second metallic part 320b due to the user. According to various embodiments, the intensity (strength) of a sensed grip can be determined based on the difference between the amplitude of the first signal transmitted to the first metallic part 310a and the amplitude of the first signal received to the second metallic part 310b by the formed current loop. For example, the closer the grip occurs to the first separator 320a by a user and the larger the area of the grip by the users, the smaller the difference between amplitudes may be, whereby it is possible to determine that the intensity of the grip by the user is large. According to various embodiments, the processor 301 can discriminate the intensity of a sensed grip in accordance with Table 2.

According to various embodiments, the communication module 303 can perform wireless communication, using the metallic part corresponding to an antenna of a plurality of metallic parts, for example, the second metallic part 310b. According to various embodiments, the processor 301 can reduce the output voltage of the antenna based on the sensed grip. For example, while a loop structure is formed at the first metallic part 310a, the first separator 320a, and the second metallic part 310b, the output voltage of the metallic part 310b that is an antenna can be reduced from 1 W to 0.5 W. According to various embodiments, it is possible to set the degree of reducing the output voltage of at least one antenna different based on the position, intensity, etc. of sensed grip.

According to various embodiments, the processor 301 can change the resonance frequency of the antenna based on the sensed grip. For example, the processor 301 can set the resonance frequency of at least one antenna included in the electronic device different by discriminating a grip by a left hand and a grip by a right hand from each other.

Figure 4:
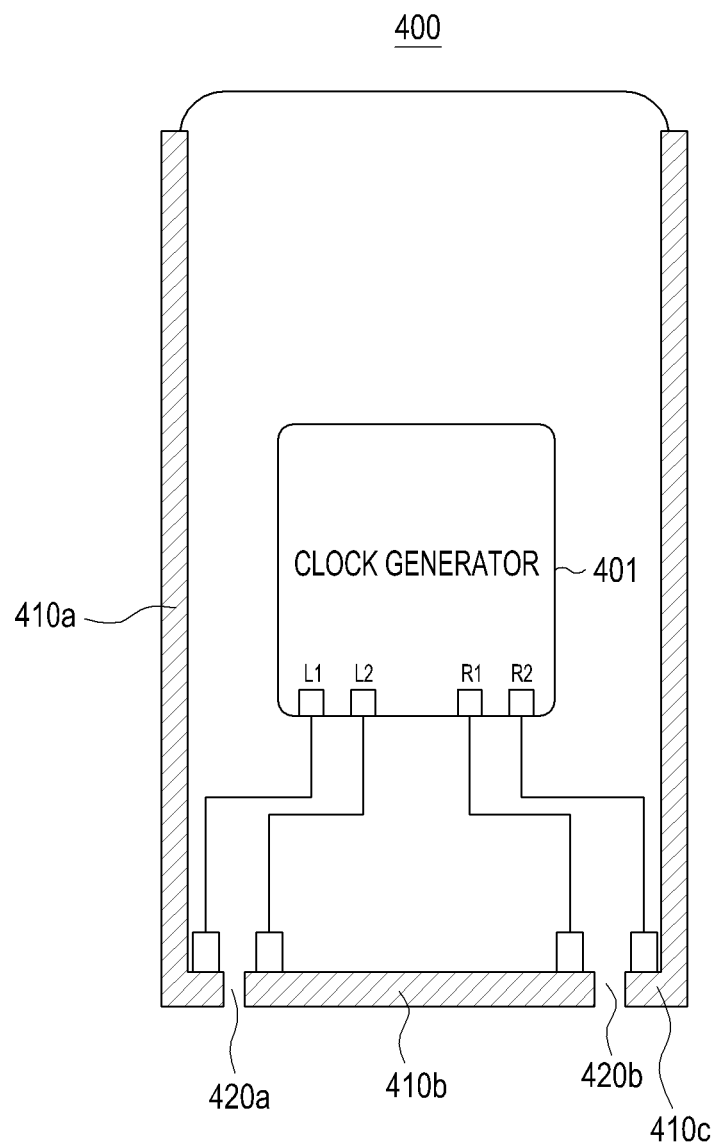
FIG. 4 is a diagram illustrating a configuration of an electronic device including two separators according to various embodiments.

FIG. 4 is a diagram illustrating an example configuration of an electronic device 400 including two separators 420a and 420b according to various embodiments.

According to various embodiments, the electronic device 400 (e.g., the electronic device 200 in FIG. 2) may include a clock generator 401 (e.g., the clock generator 302 in FIG. 3) and the clock generator 401 may be connected to a plurality of metallic parts that form at least a portion of a housing of the electronic device 400. For example, referring to FIG. 4, the electronic device 400 may include a first metallic part 410a, a second metallic part 410b, and a third metallic part 410c. Referring to FIG. 4, the electronic device 400 may include a first separator 420a between the first metallic part 410a and the second metallic part 410b and a second separator 420b between the second metallic part 410b and the third metallic part 410c. According to various embodiments, a loss of a signal that is transmitted from the first metallic part 410a to the second metallic part 410b may be large due to the first separator 420a. A loss of a signal that is transmitted from the second metallic part 410b to the third metallic part 410c may also be large due to the second separator 420b. For example, assuming that a first signal generated by the clock generator 401 is transmitted to the first metallic part 410a and a spectrum level of a signal that is transmitted to the second metallic part 410b is −65.54 dBm due to the first separator 420a, the spectrum level of a signal that is transmitted to the second metallic part 410b when a user's hand touches the first separator 420a may be −55.23 dBm. It may refer to a situation in which the signal has been transmitted to the second metallic part 410b with a loss reduced by the user's hand. The following Table 3 shows spectrum levels, which were measured in this way, of signals transmitted to the second metallic part 410b in various situations.

TABLE 3

| Test situation | Spectrum level (dBm) | Difference of signal delta(dB) |
| --- | --- | --- |
| (1) Default | −65.54 | — |
| (2) Hand approached about 15 mm from first metallic part 410a | −66.75 | 1.21 |
| (3) Hand approached about 10 mm from first metallic part 410a | −67.65 | 2.11 |
| (4) Hand approached about 5 mm from first metallic part 410a | −68.23 | 2.69 |
| (5) Hand touched first metallic part 410a | −63.54 | −2 |
| (6) Hand touched first separator 420a | −55.23 | −10.31 |
| (7) Hand touched second metallic part 410b | −65.3 | −0.24 |
| (8) Metallic member touched first separator 420a | −64.25 | −1.29 |
| (9) TA connected to electronic device | −65.23 | −0.31 |
| (10) Earphone connected to electronic device | −65.45 | −0.09 |

Referring to Table 3, the electronic device 400 according to various embodiments, may make the spectrum level (1) for a signal received to the second metallic part 410a be a reference when nothing approaches the first separator 420a (in default). In default, a loss of a signal due to the first separator 420a is large.

The closer the hand comes to the first metallic part 410a, the smaller the loss of a signal can be. For example, the measured spectrum level can be gradually reduced when (2) a hand approaches about 15 mm from the first metallic part 410a, when (3) a hand approaches about 10 mm from the first metallic part 410a, and when (4) a hand approaches about 5 mm from the first metallic part 410a. When a signal generated by the clock generator 401 is transmitted with a loss of a threshold value or less from the first metallic part 410a to the second metallic part 410b, the electronic device 400 can determine that a current loop has been formed.

According to various embodiments, the loss of a signal may be the smallest when (6) a user's hand approaches the first separator 420a and there may be a difference between a loss of a signal when (8) a metallic member approaches the first separator 420a and a loss of a signal due to a user's hand. On the basis of the difference, the electronic device 400 according to various embodiments can discriminate a grip on the electronic device by a user's hand and a grip on the electronic device by an object.

According to various embodiments, the degree of a loss of a signal when (5) a user's hand approaches the first metallic part 410a and the degree of a loss of a signal when (7) a user's hand approaches the second metallic part 410b are larger than that when (6) a user's hand approaches the first separator 420a. For example, the electronic device 400 can determine where a grip has been sensed of the first metallic part 410a, the first separator 420a, and the second metallic part 410b that are adjacent to each other.

According to various embodiments, when (9) a charge is connected to the electronic device 400 or when (10) an earphone is connected to the electronic device 400, the loss of a signal received to the second metallic part 410a is larger than that when a user's hand approaches the first separator 420a.

The electronic device 400 can determine a threshold value for the difference between when a loss of current is generated by a separator and when a loss of current is compensated by a user's hand approaching the separator, on the basis of the experimental values in Table 3. The electronic device 400 can determine whether a current loop has been formed between the first metallic part 410a and the second metallic part 410b with the first separator 420a therebetween on the basis of the determined threshold value.

Figure 5:
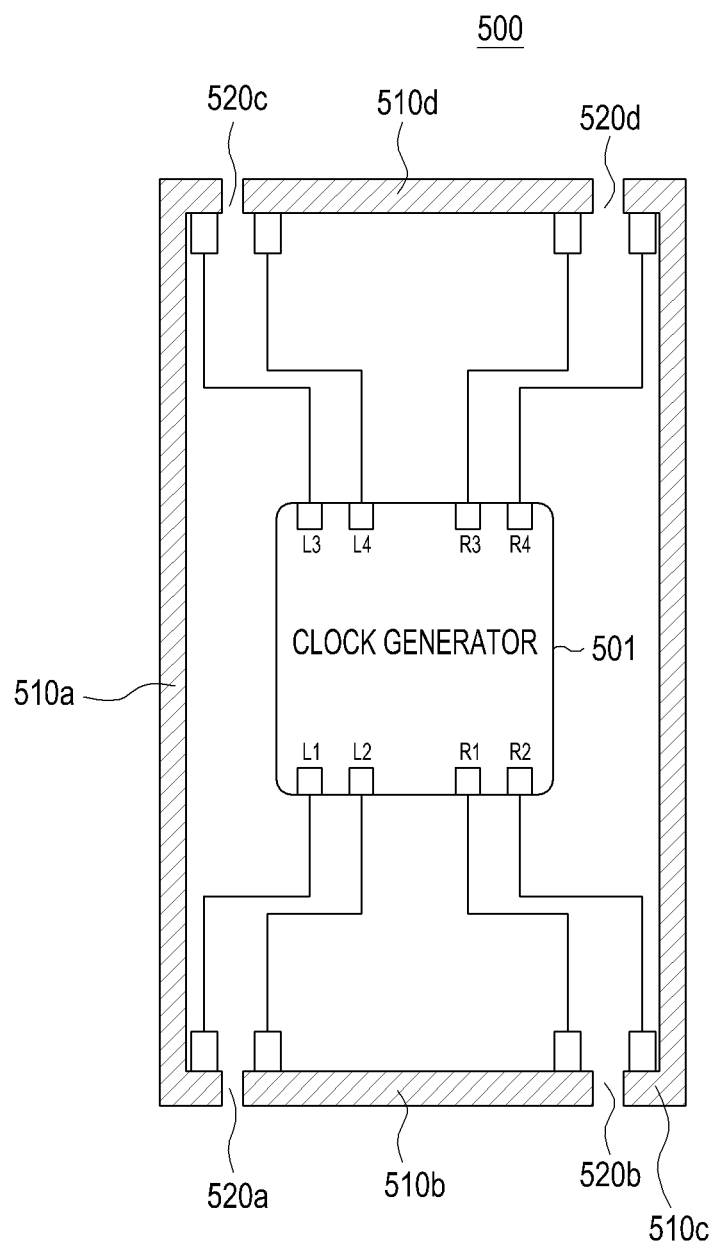
FIG. 5 is a diagram illustrating a configuration of an electronic device including four separators according to various embodiments.

FIG. 5 is a diagram illustrating an example configuration of an electronic device 500 including four separators 520a, 520b, 520c, and 520d according to various example embodiments.

According to various embodiments, the electronic device 500 (e.g., the electronic device 200 in FIG. 2) may include four metallic parts and separators disposed between the four metallic parts. The four metallic parts 510a, 510b, 510c, and 510d and the four separators 520a, 520b, 520c, and 520d may form a portion of a housing of the electronic device 500. Referring to FIG. 5, a first metallic part 510a, a second metallic part 510b, a third metallic part 510c, and a fourth metallic part 510d may be disposed adjacent to each other and a separator may be disposed between two metallic parts. For example, a first separator 520a may be disposed between the first metallic part 510a and the second metallic part 510b.

According to various embodiment, the electronic device 500 can transmit a first signal generated by the clock generator 501 to metallic parts electrically connected to a clock generator 501 and a loop structure may be formed at any one or more of the four separators. For example, when a user's hand approaches the first separator 520a, the electronic device 500 can form a current loop coming from the clock generator 501 and then going back to clock generator 501 through the first metallic part 510a, the first separator 520a, and the second metallic part 510b. The electronic device 500 can sense whether a current loop is formed at any one or more of the first separator 520a, the second separator 520b, the third separator 520c, and the fourth separator 520d, and can determine the use state of the electronic device 500 on the basis of the positions of sensed separators.

Figure 6:
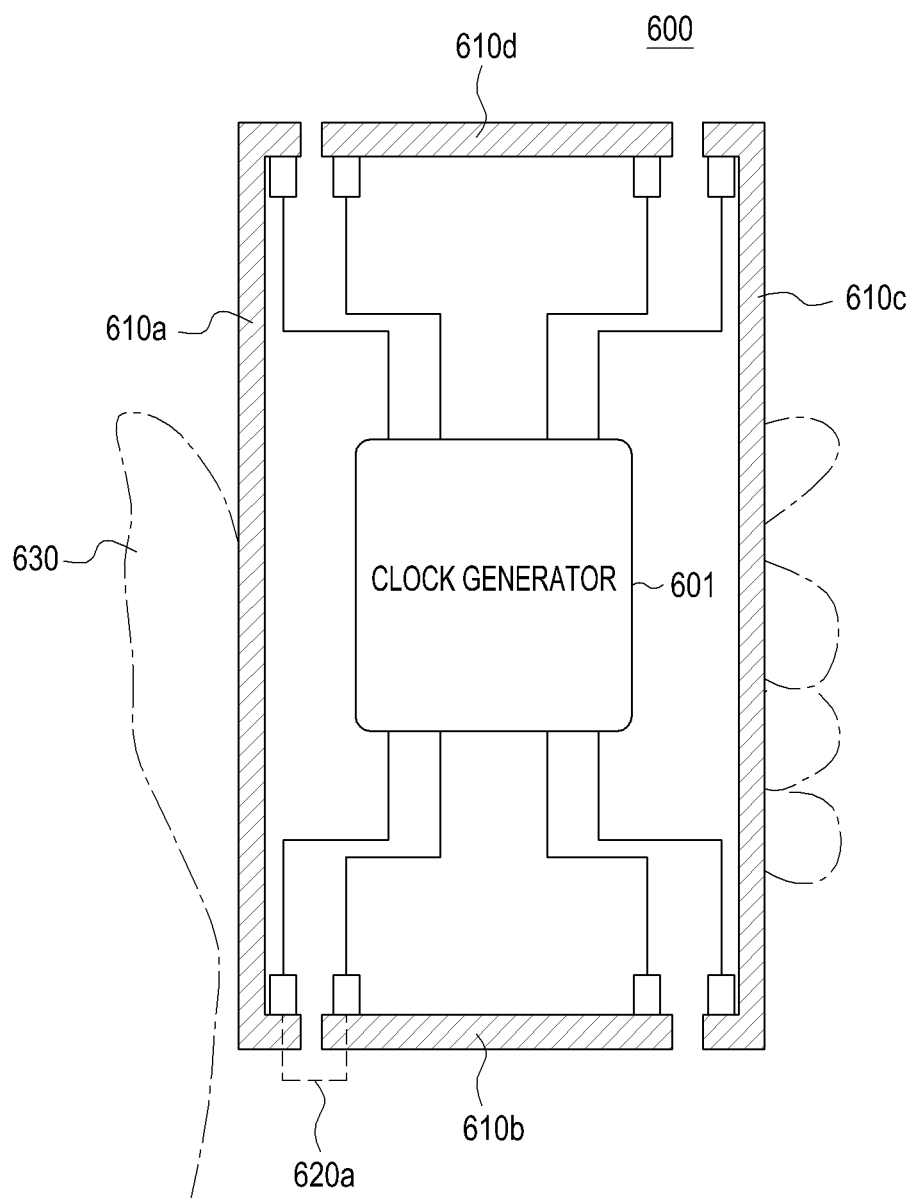
FIG. 6 is a diagram illustrating an example of a gripped state of an erected electronic device according to various embodiments.

FIG. 6 is a diagram illustrating an example of a vertically gripped state of an erected electronic device according to various example embodiments. The gripped state of an electronic device may depend on the size of the electronic device and the size of the user's hand using the electronic device. FIG. 6 illustrates a situation in which a loop structure formed at any one of four separators can be sensed when a user vertically holds an electronic device by hand.

When a user 630 holds the electronic device 600 (e.g., the electronic device 200 in FIG. 2) with a left hand, it is possible to sense that a loop structure is formed at the left separator 620a on the bottom of the electronic device 600. For example, a first signal generated by the clock generator 601 can be transmitted to an electrically connected metallic part 610a and at least a portion of the first signal is transmitted to a metallic part 610b (621) by the left hand of the user 630 touching the separator 620a, whereby a current loop structure can be formed. As shown in FIG. 6, the current loop structure may include the clock generator 601, the metallic part 610a, the user 630, the metallic part 610b and some wires connecting them. The electronic device 600 can determine a grip by the user's left hand on the basis of the loop structure formed at the separator 620a. Alternatively, the electronic device 600 can determine a grip by a user's right hand when sensing a current loop at the separator between the second metallic part 610b and the third metallic part 610c. The electronic device 600 can determine that a user grips the top of the electronic device 600 when sensing a current loop at both of the separator between the first metallic part 610a and the fourth metallic part 610d and the separator between the fourth metallic part 610d and the third metallic part 610c.

Figure 7:
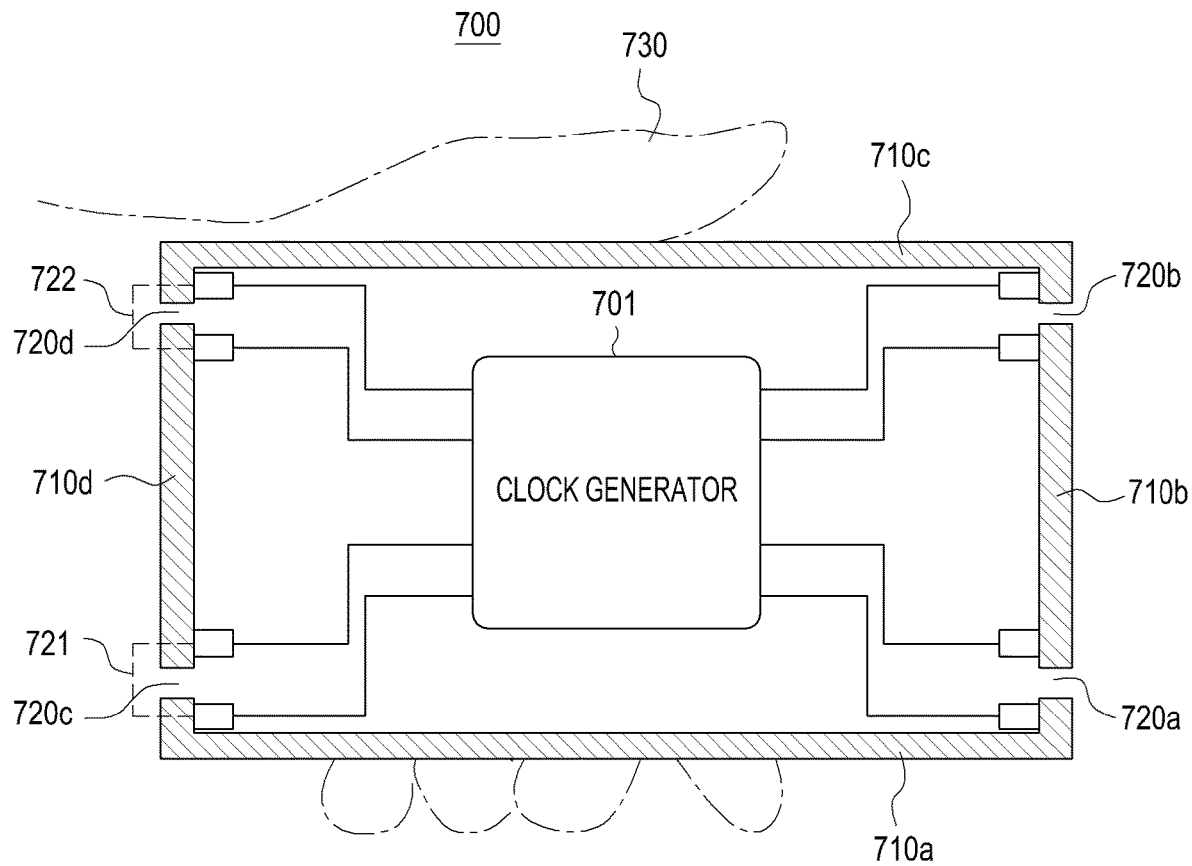
FIG. 7 is a diagram illustrating an example of a horizontally gripped state of an electronic device according to various embodiments.

FIG. 7 is a diagram illustrating an example of a horizontally gripped state of an electronic device according to various example embodiments. The gripped state of an electronic device may depend on the size of the electronic device and the size of the user's hand using the electronic device. FIG. 7 illustrates a situation in which a loop structure formed at two adjacent separators on a side of the electronic device of fourth separators can be sensed when a user horizontally holds an electronic device with a hand.

When a user 730 horizontally holds the electronic device 700 (e.g., the electronic device 200 in FIG. 2) with a left hand, it is possible to sense that a loop structure is formed at two separators 720c and 720d on the bottom of the electronic device 700. For example, a first signal generated by the clock generator 701 is transmitted to an electrically connected metallic part 710d and at least a portion of the first signal is transmitted to the metallic part 710a (721) by the left hand of the user 730 touching the two separators 720c and 720d, whereby a loop structure can be formed. Further, at least a portion of the first signal is transmitted to a metallic part 710c (722), so a loop structure can be formed. The electronic device 700 can determine a grip by the user's left hand based on the loop structure formed at the two separators 720c and 720d.

Alternatively, when a user 730 holds the electronic device 700 with a right hand, it is possible to sense that a loop structure is formed at two separators 720a and 720b on the top of the electronic device 700. The electronic device 700 can determine a grip by the user's right hand based on the loop structure formed at the two separators 720a and 720b.

Figure 8:
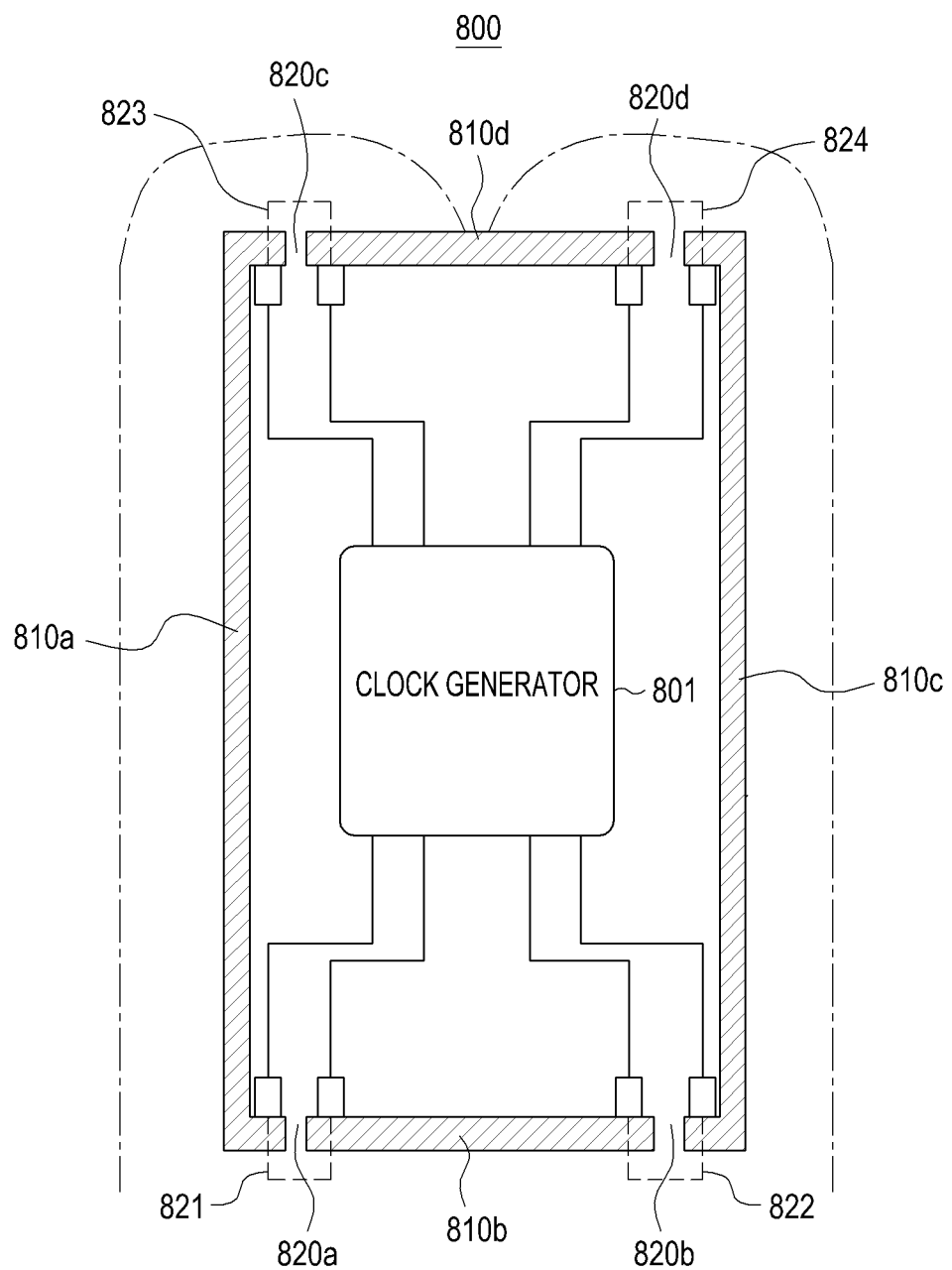
FIG. 8 is a diagram illustrating an example of a gripped state of an erected electronic device according to various embodiments.

FIG. 8 is a diagram illustrating an example of a gripped state of an erected electronic device according to various example embodiments.

According to various embodiments, an electronic device 800 (e.g., the electronic device 200 in FIG. 2) may include fourth metallic parts 810a, 810b, 810c, and 810d and four separators 820a, 820b, 820c, and 820d. According to various embodiments, the electronic device 800 can sense current loop structure at all of the four separators 820a, 820b, 820c, and 820d. For example, a first signal generated by a clock generator 801 can be transmitted to the electrically connected four metallic parts 810a, 810b, 810c, and 810d from the clock generator 801. At least a portion of the first signal transmitted to the first metallic part 810a can be transmitted to the second metallic part 810b (821) by the loop structure formed at the first separator 820a, at least a portion of the first signal transmitted to the second metallic part 810b can be transmitted to the third metallic part 810c (822) by the loop structure formed at the second separator 820b, at least a portion of the first signal transmitted to the third metallic part 810c can be transmitted to the fourth metallic part 810d (824) by the loop structure formed at the fourth separator 820d, and at least a portion of the first signal transmitted to the fourth metallic part 810d can be transmitted to the first metallic part 810a (823) by the loop structure formed at the third separator 820c. Referring to FIG. 8, when the electronic device 800 is put on the legs 830 of a user, the electronic device 800 can determine that it is on the legs 830 of the user by sensing the loop structures formed at the first separator 820a to the fourth separator 820d.

Figure 9A:
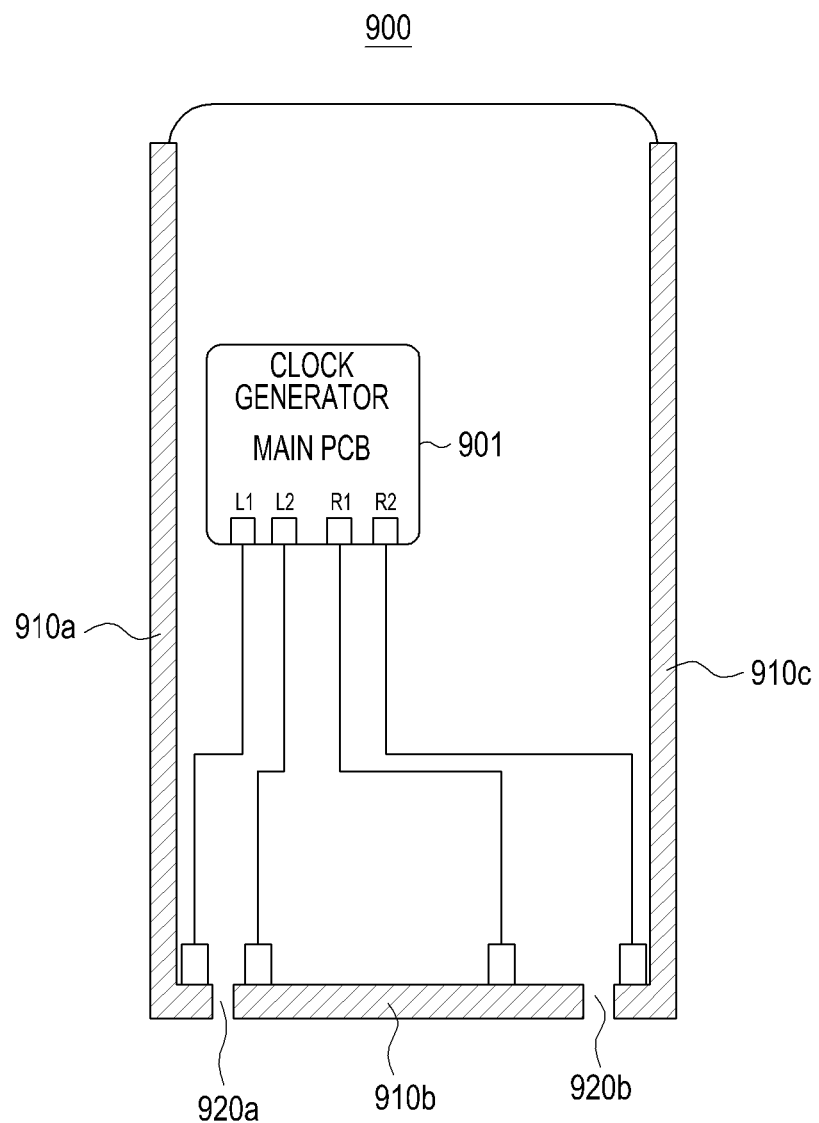
FIGS. 9A, 9B and 9C are diagrams illustrating examples of a clock generator of an electronic device according to various embodiments.
Figure 9B:
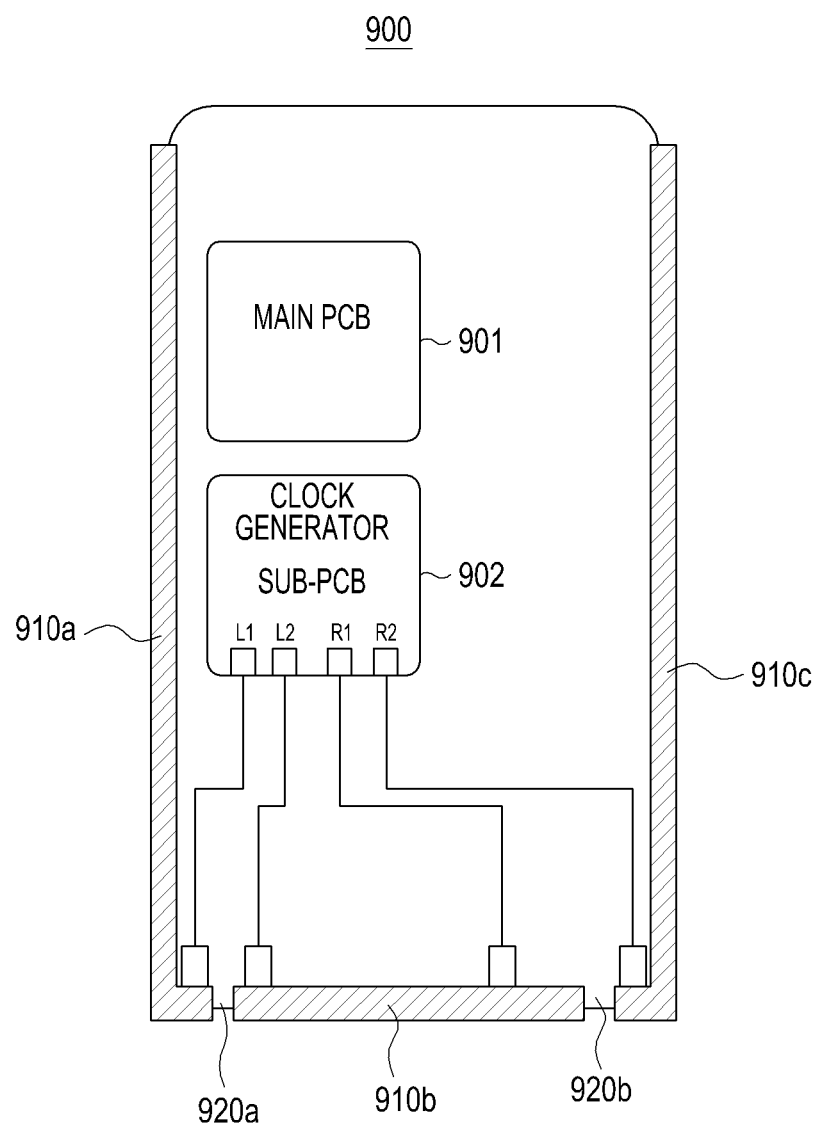
Figure 9C:
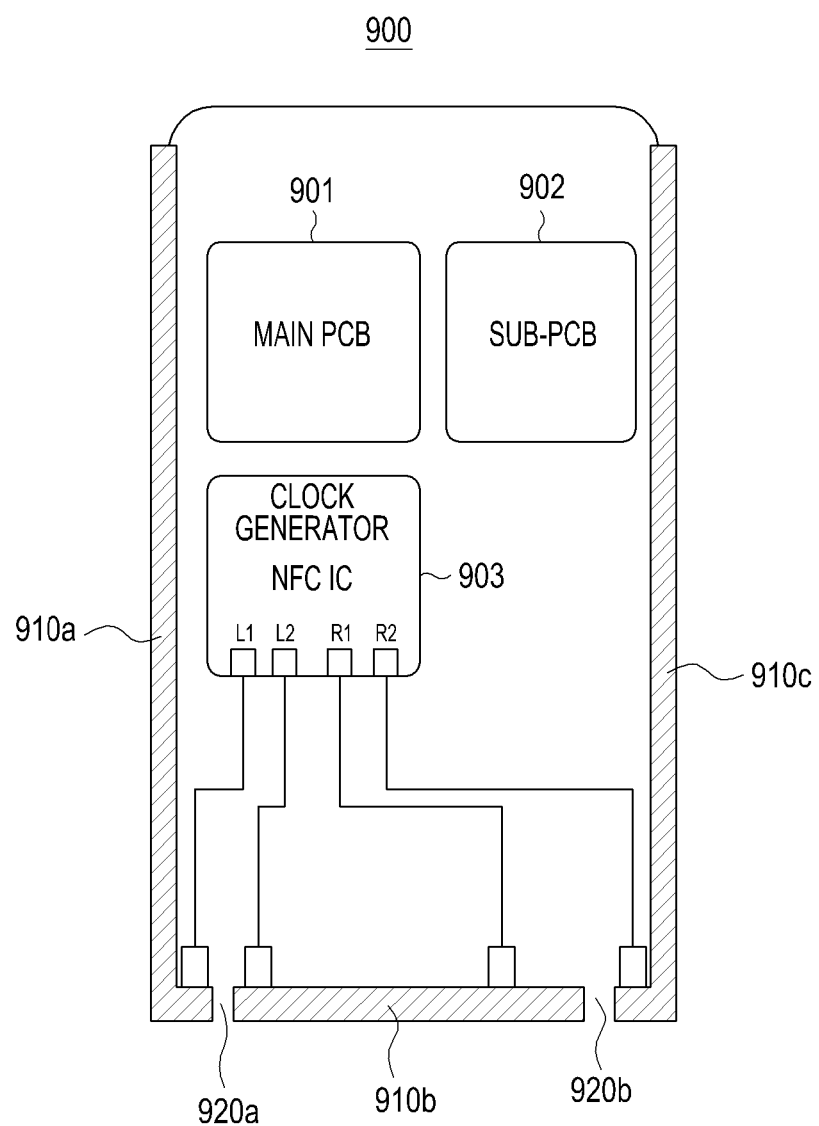

FIGS. 9A, 9B and 9C are diagrams illustrating examples of a clock generator of an electronic device according to various example embodiments. According to various embodiments, a clock generator 910 (e.g., the clock generator 202 in FIG. 2) of an electronic device 900 (e.g., the electronic device 200 in FIG. 2) can be connected to a housing of the electronic device 900. For example, as shown in FIG. 9, the clock generator 901 may be mounted on a main PCB of the electronic device 900. Wires electrically connecting the clock generator 901 to metallic parts 910a, 910b, and 910c may be provided and separators 920a and 920b may be disposed respectively between adjacent two of the metallic parts 910a, 910b, and 910c.

According to various embodiments, as shown in FIG. 9B, the electronic device 900 may include a main PCB 901 and a sub-PCB 902. For example, a clock generator 902 may be mounted on the sub-PCB 902 of the electronic device 900. Wires electrically connecting the clock generator 902 to metallic parts 910a, 910b, and 910c may be provided and separators 920a and 920b may be disposed respectively between adjacent two of the metallic parts 910a, 910b, and 910c.

According to various embodiments, as shown in FIG. 9C, the electronic device 900 may include a main PCB 901, a sub-PCB 902, and an NFC circuit 903. For example, a clock generator 903 may be mounted on the NFC circuit 903 of the electronic device 900. Wires electrically connecting the clock generator 903 to metallic parts 910a, 910b, and 910c may be provided and separators 920a and 920b may be disposed respectively between adjacent two of the metallic parts 910a, 910b, and 910c.

The configurations shown in FIGS. 9A, 9B and 9C are examples and, according to various embodiments, a clock generator and wires electrically connected to clock generator to metallic parts may be freely disposed at predetermined positions in a housing of the electronic device 900.

Figure 10:
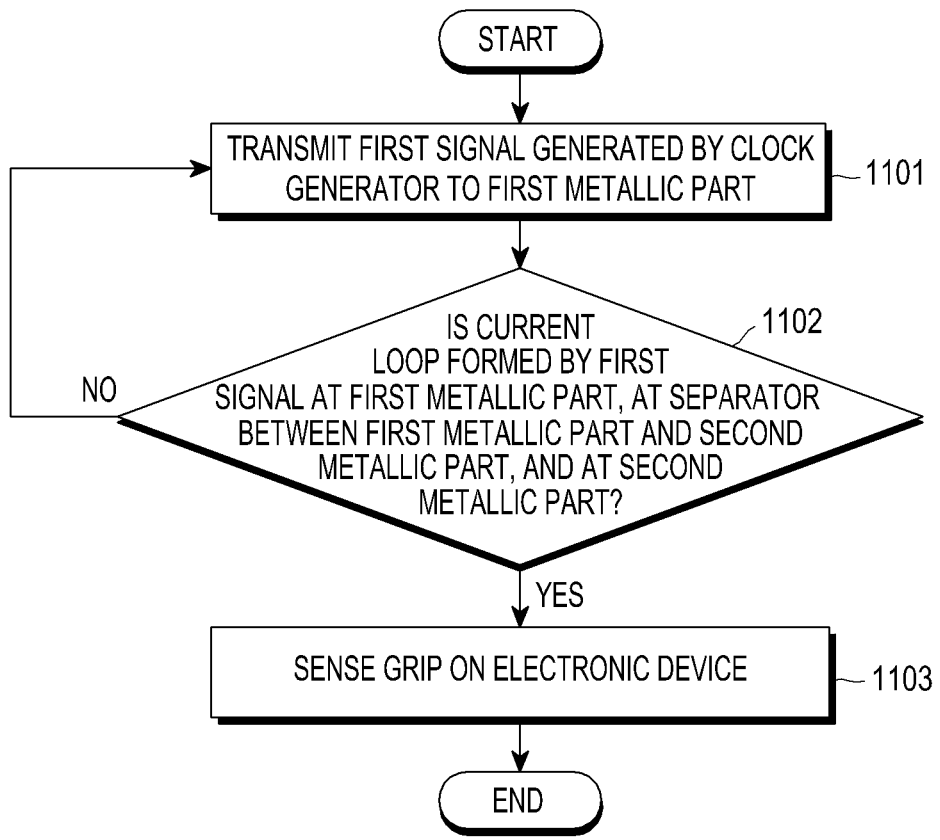
FIG. 10 is a flowchart illustrating a method of sensing a grip of an electronic device according to various embodiments.

FIG. 10 is a flowchart illustrating an example method of sensing a grip of an electronic device (e.g., the electronic device 200 or the processor 201 in FIG. 2).

In operation 1101, a first signal generated by a clock generator (e.g., the clock generator 202 in FIG. 2) of the electronic device 200 can be transmitted to a first metallic part of a plurality of metallic parts included in a housing of the electronic device 200. According to various embodiments, at least one of the metallic parts may be an antenna. The antennas can support wireless communication at different frequency bands. For example, the frequency of the first signal may be set within the range of 1 MHZ to 13 MHz. According to various embodiments, the clock generator 202 can be electrically connected to the first metallic part, and a first capacitor and a first inductor may be disposed between the clock generator 202 and the first metallic part. According to various embodiments, the clock generator 202 can be electrically connected to the second metallic part, and a second capacitor and a second inductor may be disposed between the clock generator 202 and the second metallic part.

In operation 1102, the processor 201 can determine whether a current loop is formed at the first metallic part, at the separator between the first metallic part and the second metallic part, and at the second metallic part based on the first signal. According to various embodiments, the processor 201 can determine that a current loop is formed when the difference of a loss between the first signal transmitted to the first metallic part and the first signal transmitted to the second metallic part is less than a threshold value. For example, the threshold value can be set based on experimental data. According to various embodiments, it is possible to accurately sense a grip on an electronic device by a user's hand by setting a threshold value on the basis of the degrees of losses of signals measured in various situations, as shown in Table 3.

In operation 1103, the processor 201 can sense a grip on the electronic device 200 while the first metallic part and the second metallic part form a loop structure through a separator. According to various embodiments, the processor 201 can determine the position of a grip on the electronic device based on the positions of separators. For example, when a current loop structure is formed at the right separator on the top of the electronic device 200, it is possible to determine that the right side of the top of the electronic device 200 has been gripped. According to various embodiments, the processor 201 can determine the intensity of a grip on the electronic device based on the difference first amplitude of the first signal at the first metallic part and second amplitude of the first signal at the second metallic part.

According to various embodiments, the processor 201 can reduce the output voltage of the antennas in the electronic device 200 based on the grip sensed in operation 1103. For example, when a grip on the electronic device by a user's right hand is sensed, it is possible to reduce the output voltage of the antennas to a level that satisfies standard authentication of electromagnetic wave absorption rate.

According to various embodiments, the processor 201 can change the resonance frequency of the antennas in the electronic device 200 based on the grip sensed in operation 1103. For example, it is possible to set different resonance frequency of antennas, depending on a grip on an electronic device by a user's right hand and a grip on the electronic device by a user's left hand, whereby the antenna efficiency can be improved.

Various example embodiments disclosed herein are provided merely to easily describe technical details of the present disclosure and to aid in the understanding of the present disclosure, and are not intended to limit the scope of the present disclosure. Therefore, it should be understood that all modifications and changes or modified and changed forms based on the technical idea of the present disclosure fall within the scope of the present disclosure.

What is claimed is:

1. An electronic device comprising:
a housing;
a plurality of metallic parts forming a portion of the housing;
a clock generator disposed in the housing; and
a processor,
wherein the processor is configured to sense a grip on the electronic device based on a current loop formed by a first signal generated by the clock generator and transmitted through a first metallic part and a second metallic part of the plurality of the metallic parts,
wherein the second metallic part is disposed adjacent to the first metallic part with a first separator disposed between the first metallic part and the second metallic part and configured to electrically separate the first metallic part and the second metallic part.

2. The electronic device of claim 1, wherein at least one of the plurality of metallic parts comprises an antenna.

3. The electronic device of claim 1, wherein the processor is configured to determine that the current loop is formed, when a difference of a loss between the first signal transmitted to the first metallic part and the first signal transmitted to the second metallic part is less than a threshold value.

4. The electronic device of claim 1, wherein the processor is configured to determine the position of a grip on the electronic device based on a position of the first separator.

5. The electronic device of claim 1, wherein the processor is configured to determine an intensity of a grip on the electronic device based on a difference between a first amplitude of the first signal at the first metallic part and a second amplitude of the first signal at the second metallic part.

6. The electronic device of claim 1, wherein the frequency of the first signal is within a range of 1 MHz to 13 MHz.

7. The electronic device of claim 1, wherein the clock generator is electrically connected to the first metallic part, the electronic device further comprising a first capacitor and a first inductor disposed between the clock generator and the first metallic part, and
the clock generator is electrically connected to the second metallic part, the electronic device further comprising a second capacitor and a second inductor disposed between the clock generator and the second metallic part.

8. The electronic device of claim 2, wherein the processor is configured to reduce an output voltage of the antenna based on the sensed grip.

9. The electronic device of claim 2, wherein the processor is configured to change a resonance frequency of the antenna based on the sensed grip.

10. The electronic device of claim 1, wherein the first separator comprises a nonconductive member.

11. A method of sensing a grip on an electronic device, the method comprising:
transmitting a first signal generated by a clock generator included in an electronic device to a first metallic part of a plurality of metallic parts forming a portion of a housing of the electronic device; and
sensing a grip on the electronic device based on a current loop formed by the first signal transmitted through the first metallic part and a second metallic part from among the plurality of metallic parts,
wherein the second metallic part is disposed adjacent to the first metallic part with a first separator disposed between the first metallic part and the second metallic part and configured to electrically separate the first metallic part and the second metallic part.

12. The method of claim 11, wherein at least one of the plurality of metallic parts comprises an antenna.

13. The method of claim 11, wherein the sensing of a grip includes determining that the current loop is formed, when a difference of a loss between the first signal transmitted to the first metallic part and the first signal transmitted to the second metallic part is less than a threshold value.

14. The method of claim 11, further comprising determining a position of a grip on the electronic device based on a position of the first separator.

15. The method of claim 11, further comprising determining an intensity of a grip on the electronic device based on a difference between a first amplitude of the first signal at the first metallic part and a second amplitude of the first signal at the second metallic part.

16. The method of claim 11, wherein a frequency of the first signal is within a range of 1 MHz to 13 MHz.

17. The method of claim 12, further comprising reducing an output of the antenna based on the sensed grip.

18. The method of claim 12, further comprising changing a resonance frequency of the antenna based on the sensed grip.

19. The method of claim 11, wherein the first separator comprises a nonconductive member.

20. A non-transitory computer-readable recording medium having stored thereon instructions, which when executed by a processor, cause an electronic device to perform at least one operation, wherein the at least one operation includes:

transmitting a first signal generated by a clock generator included in an electronic device to a first metallic part of a plurality of metallic parts forming a portion of a housing of the electronic device; and sensing a grip on the electronic device based on a current loop formed by the first signal transmitted through the first metallic part and a second metallic part of the plurality of metallic parts, wherein the second metallic part is disposed adjacent to the first metallic part with a first separator disposed between the first metallic part and the second metallic part and configured to electrically separate the first metallic part and the second metallic part.

\* \* \* \* \*